United States Patent [19]
Keeth

[11] Patent Number: 6,016,282
[45] Date of Patent: Jan. 18, 2000

[54] CLOCK VERNIER ADJUSTMENT

[75] Inventor: Brent Keeth, Boise, Id.

[73] Assignee: Micron Technology, Inc., Boise, Id.

[21] Appl. No.: 09/086,401

[22] Filed: May 28, 1998

[51] Int. Cl.[7] .................................................. G11C 13/00
[52] U.S. Cl. .............. 365/233; 365/189.05; 365/230.06; 365/230.08
[58] Field of Search .............................. 365/233, 189.01, 365/230.06, 230.08

[56] References Cited

U.S. PATENT DOCUMENTS

| | | | |
|---|---|---|---|
| 3,633,174 | 1/1972 | Griffin | 340/172.5 |
| 4,077,016 | 2/1978 | Sanders et al. | 331/4 |
| 4,096,402 | 6/1978 | Schroeder et al. | 307/362 |
| 4,404,474 | 9/1983 | Dingwall | 307/260 |
| 4,481,625 | 11/1984 | Roberts | 365/233 |
| 4,511,846 | 4/1985 | Nagy et al. | 328/164 |
| 4,514,647 | 4/1985 | Shoji | 307/269 |
| 4,600,895 | 7/1986 | Landsman | 331/1 A |
| 4,638,187 | 1/1987 | Boler et al. | 307/451 |
| 4,687,951 | 8/1987 | McElroy | 307/269 |
| 4,773,085 | 9/1988 | Cordell | 375/120 |
| 4,789,796 | 12/1988 | Foss | 307/443 |
| 4,893,087 | 1/1990 | Davis | 328/14 |

(List continued on next page.)

FOREIGN PATENT DOCUMENTS

| | | |
|---|---|---|
| 0 295 515 A1 | 12/1988 | European Pat. Off. . |
| 0 406 786 A1 | 1/1991 | European Pat. Off. . |
| 0 450 871 A2 | 10/1991 | European Pat. Off. . |
| 0 476 585 A3 | 3/1992 | European Pat. Off. . |
| 0 655 741 A2 | 5/1995 | European Pat. Off. . |
| 0 655 834 A1 | 5/1995 | European Pat. Off. . |
| 0 680 049 A2 | 11/1995 | European Pat. Off. . |
| 0 703 663 A1 | 3/1996 | European Pat. Off. . |
| 0 704 848 A3 | 4/1996 | European Pat. Off. . |
| 0 704 975 A1 | 4/1996 | European Pat. Off. . |
| 0 767 538 A1 | 4/1997 | European Pat. Off. . |

(List continued on next page.)

OTHER PUBLICATIONS

Alvarez, J. et al. "A Wide–Bandwidth Low Voltage PLL for PowerPC ™ Microprocessors" IEEE IEICE Trans. Electron., vol. E–78. No. 6, Jun. 1995, pp. 631–639.

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel x 1K Time Memory LSI with 1–ns/b Resolution", IEEE Journal of Solid–State Circuits, vol. 27, No. 3, M, 8107 Mar., 1992, No. 3, New York, US, pp. 359–364 and pp. 528–531.

Arai, Y. et al., "A Time Digitizer CMOS Gate–Array with a 250 ps Time Resolution", XP 000597207, IEEE Journal of Solid–State Circuits, vol. 31, No. 2, Feb. 1996, pp. 212–220.

Aviram, A. et al., "Obtaining High Speed Printing on Thermal Sensitive Special Paper with a Resistive Ribbon Print Head", IBM Technical Disclosure Bulletin, vol. 27, No. 5, Oct. 1984, pp. 3059–3060.

(List continued on next page.)

*Primary Examiner*—Terrell W. Fears
*Attorney, Agent, or Firm*—Seed and Berry LLP

[57] ABSTRACT

A integrated circuit, such as a memory integrated circuit, includes a vernier clock adjustment circuit receiving an input clock signal and providing a rising-edge clock signal representing the input clock signal delayed by a rising-edge delay and providing a falling-edge clock signal representing the input clock signal delayed by a falling-edge delay. An edge triggered circuit receives data and the rising-edge and falling-edge clock signals, and stores data at the rising-edge of the rising-edge clock signal and at the falling-edge of the falling-edge clock signal. One form of the invention is a memory system having a memory controller coupled to memory modules through data and command busses. Each memory module includes the vernier clock adjustment circuitry.

62 Claims, 9 Drawing Sheets

U.S. PATENT DOCUMENTS

| | | | |
|---|---|---|---|
| 4,902,986 | 2/1990 | Lesmeister | 331/25 |
| 4,958,088 | 9/1990 | Farah-Bakhsh et al. | 307/443 |
| 4,984,204 | 1/1991 | Sato et al. | 365/189.11 |
| 5,020,023 | 5/1991 | Smith | 364/900 |
| 5,038,115 | 8/1991 | Myers et al. | 331/2 |
| 5,086,500 | 2/1992 | Greub | 395/550 |
| 5,087,828 | 2/1992 | Sato et al. | 307/269 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,212,601 | 5/1993 | Wilson | 360/51 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,283,631 | 2/1994 | Koerner et al. | 307/451 |
| 5,295,164 | 3/1994 | Yamamura | 375/120 |
| 5,311,481 | 5/1994 | Casper et al. | 365/230.06 |
| 5,311,483 | 5/1994 | Takasugi | 365/233 |
| 5,321,368 | 6/1994 | Hoelzle | 328/63 |
| 5,337,285 | 8/1994 | Ware et al. | 365/227 |
| 5,347,177 | 9/1994 | Lipp | 307/443 |
| 5,347,179 | 9/1994 | Casper et al. | 307/451 |
| 5,355,391 | 10/1994 | Horowitz et al. | 375/36 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,408,640 | 4/1995 | MacIntyre et al. | 395/550 |
| 5,410,263 | 4/1995 | Waizman | 327/141 |
| 5,416,436 | 5/1995 | Rainard | 327/270 |
| 5,420,544 | 5/1995 | Ishibashi | 331/11 |
| 5,428,311 | 6/1995 | McClure | 327/276 |
| 5,430,676 | 7/1995 | Ware et al. | 365/189.02 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,440,514 | 8/1995 | Flannagan et al. | 365/194 |
| 5,446,696 | 8/1995 | Ware et al. | 365/222 |
| 5,448,193 | 9/1995 | Baumert et al. | 327/156 |
| 5,451,898 | 9/1995 | Johnson | 327/563 |
| 5,457,407 | 10/1995 | Shu et al. | 326/30 |
| 5,465,076 | 11/1995 | Yamauchi et al. | 331/179 |
| 5,473,274 | 12/1995 | Reilly et al. | 327/159 |
| 5,473,575 | 12/1995 | Farmwald et al. | 365/230.06 |
| 5,473,639 | 12/1995 | Lee et al. | 375/376 |
| 5,485,490 | 1/1996 | Leung et al. | 375/371 |
| 5,488,321 | 1/1996 | Johnson | 327/66 |
| 5,489,864 | 2/1996 | Ashuri | 327/161 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,539,345 | 7/1996 | Hawkins | 327/150 |
| 5,544,203 | 8/1996 | Casasanta et al. | 375/376 |
| 5,552,727 | 9/1996 | Nakao | 327/159 |
| 5,568,075 | 10/1996 | Curran et al. | 327/172 |
| 5,568,077 | 10/1996 | Sato et al. | 327/199 |
| 5,572,557 | 11/1996 | Aoki | 375/376 |
| 5,574,698 | 11/1996 | Raad | 365/230.06 |
| 5,576,645 | 11/1996 | Farwell | 327/94 |
| 5,577,236 | 11/1996 | Johnson et al. | 395/551 |
| 5,578,940 | 11/1996 | Dillon et al. | 326/30 |
| 5,578,941 | 11/1996 | Sher et al. | 326/34 |
| 5,579,326 | 11/1996 | McClure | 371/61 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,594,690 | 1/1997 | Rothenberger et al. | 365/189.01 |
| 5,614,855 | 3/1997 | Lee et al. | 327/158 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,621,739 | 4/1997 | Sine et al. | 371/22.1 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,657,481 | 8/1997 | Farmwald et al. | 395/551 |
| 5,668,763 | 9/1997 | Fujioka et al. | 365/200 |
| 5,692,165 | 11/1997 | Jeddeloh et al. | 395/551 |
| 5,694,065 | 12/1997 | Hamasaki et al. | 327/108 |
| 5,712,580 | 1/1998 | Baumgartner et al. | 327/12 |
| 5,719,508 | 2/1998 | Daly | 327/12 |
| 5,751,665 | 5/1998 | Tanoi | 368/120 |
| 5,789,947 | 8/1998 | Sato | 327/3 |

FOREIGN PATENT DOCUMENTS

| | | |
|---|---|---|
| 6-1237512 | 10/1986 | Japan . |
| 2-112317 | 4/1990 | Japan . |
| 4-135311 | 5/1992 | Japan . |
| 5-136664 | 6/1993 | Japan . |
| 5-282868 | 10/1993 | Japan . |
| 0-7319577 | 12/1995 | Japan . |
| WO 94/29871 | 12/1994 | WIPO . |
| WO 95/22200 | 8/1995 | WIPO . |
| WO 95/22206 | 8/1995 | WIPO . |
| WO 96/10866 | 4/1996 | WIPO . |
| WO 97/14289 | 4/1997 | WIPO . |
| WO 97/42557 | 11/1997 | WIPO . |

OTHER PUBLICATIONS

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Descriptive literature entitled, "400MHz SLDRAM, 4M × 16 SLDRAM Pipelined, Eight Bank, 2.5 V Operation," SLDRAM Consortium Advance Sheet, published throughout the United States, pp. 1–22.

Donnelly, K. et al., "A 660 MB/s Interface Megacell Portable Circuit in 0.3μm–0.7μm CMOS ASIC", IEEE Journal of Solid–State Circuits, vol. 31, No. 12, Dec. 1996, pp. 1995–2001.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Goto, J. et al., "A PLL–Based Programmable Clock Generator with 50–to 350–MHz Oscillating Range for Video Signal Processors", IEICE Trans. Electron., vol. E77–C, No. 12, Dec. 1994, pp. 1951–1956.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6μm CMOS SOG", IEEE Custom Integrated Circuits Conference, 1992, pp. 27.6.1–27.6.4.

Kim, B. et al., "A 30MHz High–Speed Analog/Digital PLL in 2μm CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U. et al., "A 30–ps Jitter, 3.6–μs Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Capability and 0.08–400MHz Operating Range," IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffer Using a Frequency–and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol. E–79–C. No. 7, Jul. 1996, pp. 898–904.

von Kaenel, V. et al., "A 320 MHz, 1.5 m W @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al., "A 622–Mb/s Bit/Frame Synchronizer for High–Speed Backplane Data Communication", IEEE Journal of Solid–State Circuits, vol. 31, No. 7, Jul. 1996, pp. 1063–1066.

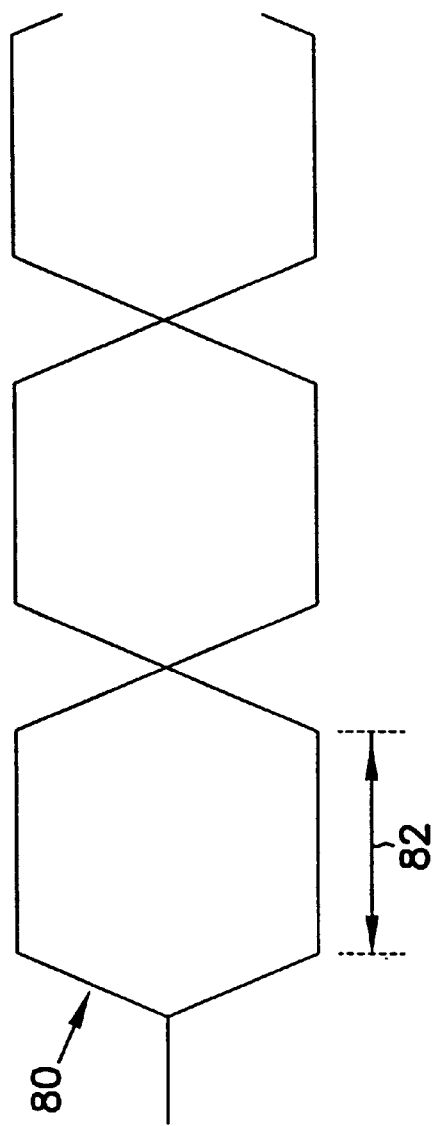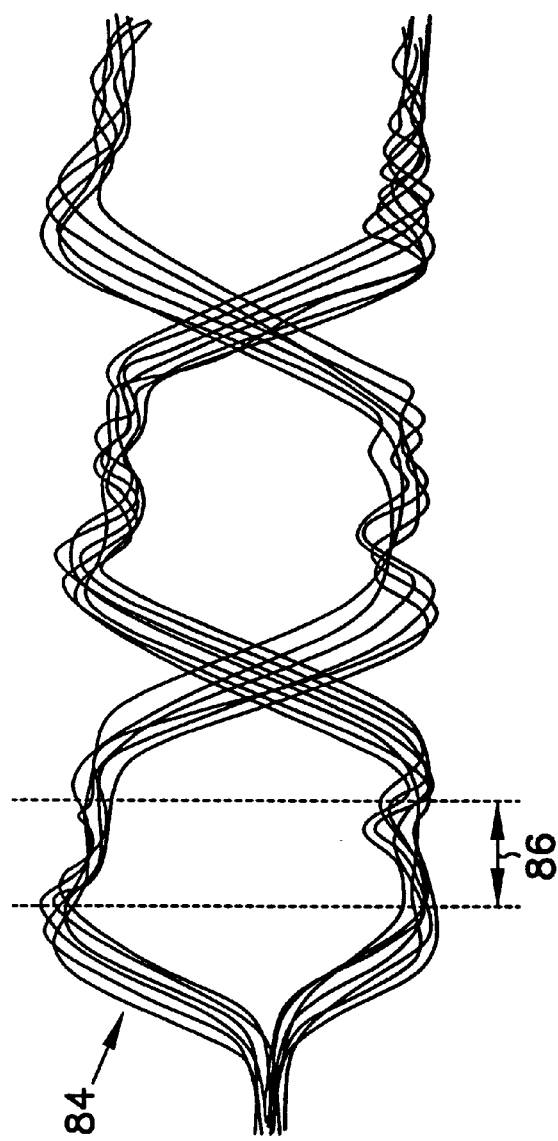

CLOCK VERNIER ADJUSTMENT

THE FIELD OF THE INVENTION

The present invention relates generally to integrated circuits, and more particularly to clock adjustments in memory systems, such as memory systems including dynamic random access memories (DRAMs).

BACKGROUND OF THE INVENTION

Integrated circuits typically include a number of input/output pins which are used for communication with additional circuitry. For example, an integrated memory device, such as a dynamic random access memory (DRAM), includes both control inputs for receiving memory operation control signals, and data pins for bi-directional data communication with an external system or processor.

The data transmission rate of modem integrated circuits is primarily limited by internal circuitry operating speeds. That is, communication networks have been developed which can transmit signals between circuitry at a rate that is faster than the capacity of many integrated circuits. To address the need for faster circuits, a group of integrated circuits can be combined on a common bus and be controlled by a common controller. In this configuration, each integrated circuit operates in a coordinated manner with the other integrated circuits to share data which is transmitted at a high speed. For example, a group of memory devices, such as DRAMs, static RAMs, or read only memories (ROM), can be connected to a common data bus and be controlled by a memory controller to form a memory system. The data rate of the bus may be substantially faster than the feasible operating speed of the individual memories. Each memory, therefore, is operated so that while one memory is processing received data, another memory is receiving new data. Such a memory system with an appropriate number of memory devices and an efficient memory controller can achieve very high speed data transmissions.

As the transmission rate of the data communication signals in such memory systems continues to increase, new circuitry and methods are needed to accurately clock command data, write data, and read data transmitted between the memory controller and the memory devices. The portion of a clock cycle which can be devoted to clocking valid data becomes quite small, and errors in clocking data can occur, at these increased transmission speeds because of known effects such as duty cycle variation, bus position of a given memory device, timing drift, loading variations, clock jitter, clock skew, noise, overshoot, and ringing.

Therefore, for the reasons stated above, and for other reasons presented in greater detail in the Description of the Preferred Embodiments section of the present specification, there is a need in the art for a memory system which more accurately and precisely compensates for such effects as duty cycle variation, bus position of a given memory device, timing drift, loading variations, clock jitter, clock skew, noise, overshoot, and ringing so that data can be accurately clocked in the memory devices.

SUMMARY OF THE INVENTION

The present invention provides a method and integrated circuit including a vernier clock adjustment circuit receiving an input clock signal and providing a rising-edge clock signal representing the input clock signal delayed by a rising-edge delay and providing a falling-edge clock signal representing the input clock signal delayed by a falling-edge delay. An edge triggered circuit receives data and the rising-edge and falling-edge clock signals, and stores data at the rising-edge of the rising-edge clock signal and at the falling-edge of the falling-edge clock signal.

In one embodiment of the integrated circuit according to the present invention, the rising-edge and falling-edge delays are programmable delays.

In one embodiment of the integrated circuit of the present invention a rising-edge delay circuit receiving the input clock signal and independently provides the rising-edge clock signal, and a falling-edge delay circuit receiving the input clock signal and independently provides the falling-edge clock signal. In another embodiment of the integrated circuit, a rising-edge delay circuit receives the input clock signal and provides the rising-edge clock signal, and a falling-edge delay circuit receives the rising-edge clock signal and providing the falling-edge clock signal. In another embodiment of the integrated circuit, a falling-edge delay circuit receives the input clock signal and provides the falling-edge clock signal, and a rising-edge delay circuit receives the falling-edge clock signal and provides the rising-edge clock signal.

One form of the present invention is a memory system including a memory controller and memory modules for storing data. A data bus carries write data from the memory controller to the memory modules and carries read data from the memory modules to the memory controller. A command bus carries commands from the memory controller to the memory modules. A clock line carries an input clock signal from the memory controller to the memory modules. Each memory module includes at least one vernier clock adjustment circuit receiving the input clock signal and providing a rising-edge clock signal representing the input clock signal delayed by a rising-edge delay and providing a falling-edge clock signal representing the input clock signal delayed by a falling-edge delay. Each memory module also includes at least one edge triggered circuit receiving read or write data and the rising-edge and falling-edge clock signals, and storing read or write data at the rising-edge of the rising-edge clock signal and at the falling-edge of the falling-edge clock signal. Such vernier adjustment circuitry can also be employed for clocking commands into the memory modules. The memory modules can include one or more memory integrated circuits, such as dynamic random access memories (DRAMs).

The vernier clock adjustment circuitry and method according to the present invention more accurately and precisely compensates for the effects of duty cycle variation, bus position of a given memory device, timing drift, loading variations, clock jitter, clock skew, noise, overshoot, and ringing by individually adjusting both the rising-edge and falling-edge timings, either independently or interdependently from each other. As a result, data is accurately clocked in the memory devices even at higher data transmission rates.

BRIEF DESCRIPTION OF THE DRAWINGS

FIG. 8A is a timing diagram illustrating an ideal signal waveform.

FIG. 8B is a timing diagram illustrating a non-ideal signal waveform.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to a dynamic random access memory (DRAM) and memory systems including DRAMs. The present invention can, however, be implemented in any integrated circuit and other memory systems including other types of memory integrated circuits. The DRAM according to the present invention is similar in many respects to conventional DRAMs, such as those commercially available from Micron Technology, Inc. of Boise, Id. For clarity, only a portion of the well-known circuitry of the DRAM is described herein, while the new circuitry of the DRAM of the present invention is described in detail herein.

Overview of Memory Systems

Figure 1:
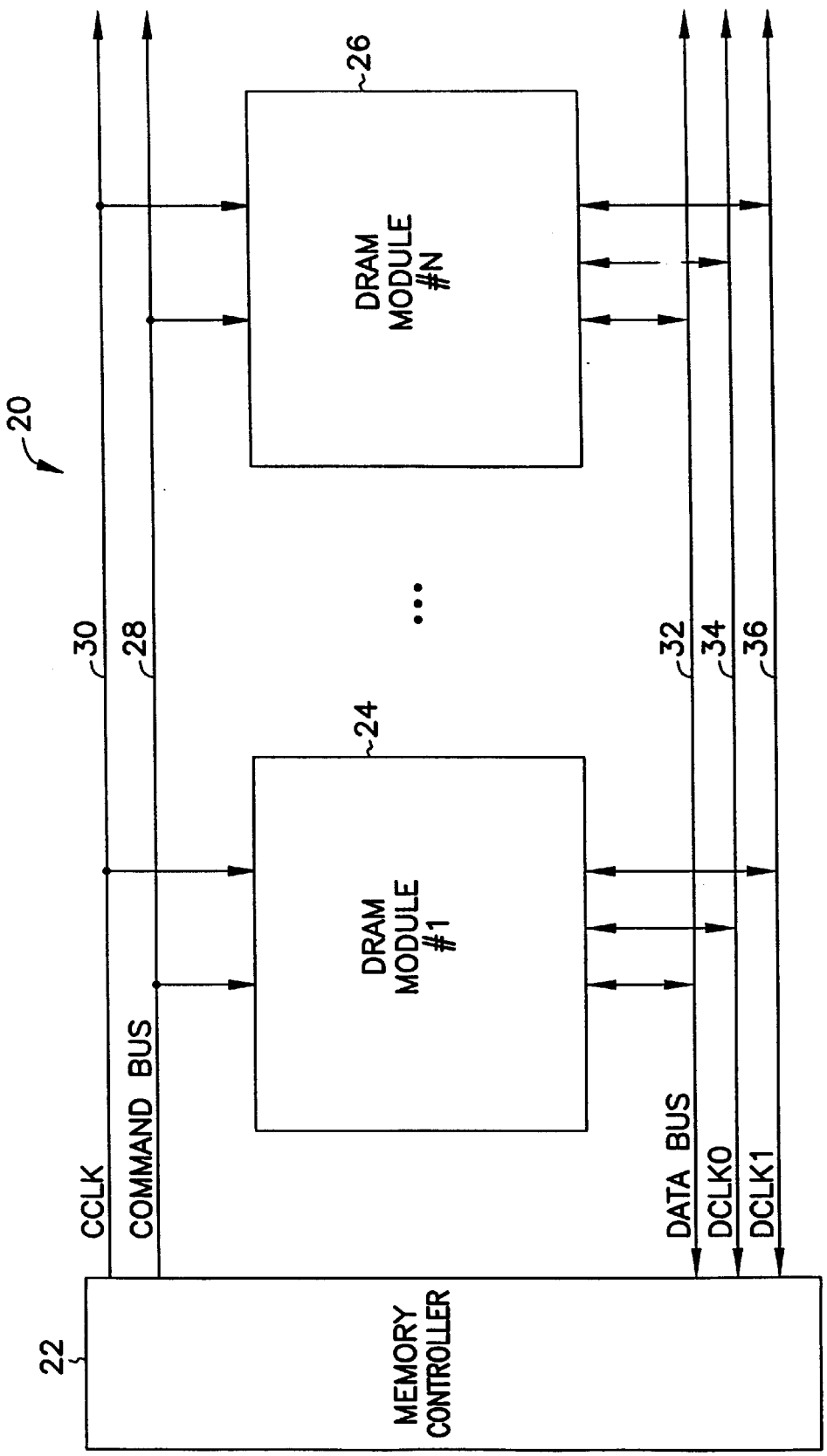
FIG. 1 is a block diagram of one embodiment of a memory system.

A memory system is illustrated generally at 20 in FIG. 1. Memory system 20 includes a memory controller 22 and N DRAM modules such as indicated at 24 and 26. The DRAM modules, such as modules 24 and 26, each comprise at least one DRAM device. A command bus 28 is an unidirectional bus for carrying address and control information from memory controller 22 to the DRAM modules. Address and control information is typically transferred from memory controller 22 on command bus 28 in uniform packets. For example, if a packet is four times the width of command bus 28, a command packet is transferred in four cycles on each edge of a free-running clock (CCLK) provided on a clock line 30 from memory controller 22. A data bus 32 is a bidirectional bus carrying write data from memory controller 22 to the DRAM modules and further carrying read data from the DRAM modules to memory controller 22. Two bidirectional data clocks, DCLK0 and DCLK1, are respectively provided on clock line 34 and clock line 36.

Data clocks DCLK0 and DCLK1 are used to precisely transfer read data timing from the DRAM modules to the memory controller 22 and to further precisely transfer write data timing from memory controller 22 to the DRAM modules. Both rising edge and falling edge transitions of the selected DCLK are employed to clock the input latches of the DRAM modules and memory controller receiving data. The data clocks DCLK0 and DCLK1 follow the same path as data provided on data bus 32 to reduce the effects of clock jitter, duty cycle variation, bus position, drift timing, and loading variations.

When control of data bus 32 is transferred from one device in memory system 20 to another device in memory system 20, such as from memory controller 22 to DRAM module 24, from DRAM module 24 to memory controller 22, or from DRAM module 24 to DRAM module 26, one DCLK is deactivated and the other DCLK is activated. Memory controller 22 determines which DCLK is to be used for a given read or write operation and provides the information indicating which DCLK to use in the command packet provided on command bus 28.

Memory system 20 accommodates for minimum and maximum delays from command at memory controller 22 to read data at memory controller 22 from the different DRAM modules by programming vernier clock adjustment circuits in each DRAM module. Preferably, the vernier adjustments in each DRAM module provide coarse steps defined in bit periods and fine steps to cover adjustments within a single bit period.

Figure 2:
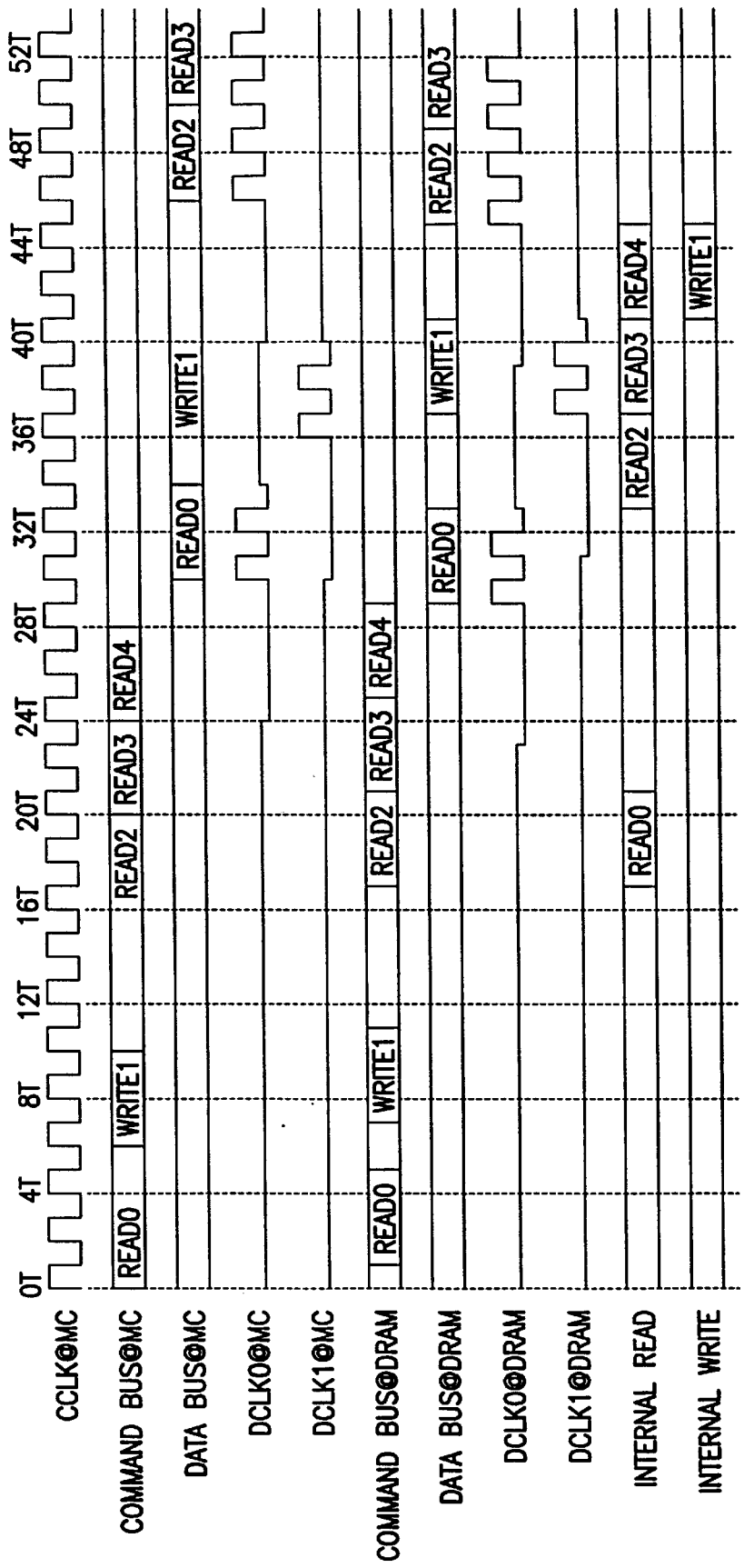
FIG. 2 is a timing diagram illustrating the bus timing of the memory system of FIG. 1.

FIG. 2 is a timing diagram illustrating bus timing for memory system 20. As illustrated in FIG. 2, CCLK has a falling or rising edge transition every T nanoseconds (Nsec). For example, T is 2.5 Nsec in one embodiment of memory system 20. FIG. 2 illustrates a sequence of four T read and write first operations. The bus propagation delay from command bus 28 at memory controller 22 to command bus 28 at a DRAM module is shown to be a maximum of one clock transition of the CCLK (1 T).

As illustrated in FIG. 2, the DRAM module performs an internal Read0 operation at time 17 T. The DRAM module vernier clock adjustment is programmed to provide read data beginning at time 29 T, so that read data arrives at memory controller 22 at time 30 T. With the programmed vernier clock adjustment in each DRAM module, the loop-around delay from command to data burst at memory controller 22, for both read and write operations is maintained at 30 T. The DRAM module provides a read data clock to memory controller 22 with the DCLK0 on clock line 34.

A 2 T time gap is inserted between the read0 command burst operation and a write1 command burst operation to permit control of data bus 32 to be transferred from memory controller 22 to the DRAM module. Thus, write data is provided at time 36 T at memory controller 22 which correspondingly arrives at the DRAM module at time 37 T. An internal write operation is performed immediately on the received write data at the DRAM module at time 41 T. Memory controller 22 provides a write data clock to the DRAM module with the DCLK1 on clock line 36.

A sequence of gapless read burst commands (i.e., read2, read3, and read4) follow the write1 command. The read2–4 burst commands are transmitted to a single DRAM module. Thus, timing gaps are not required in the sequence of read burst commands because the same device is driving data bus 32 during all of these read operations. A 6 T gap is inserted between the write1 command and the first read command of the sequence of read commands (i.e., read2 command) to permit bus settling.

Memory system 20 may include only one DRAM device per DRAM module. A memory system which includes several DRAM devices per DRAM module is illustrated generally at 120 in FIG. 3. Memory system 120 includes a memory controller 122 and N DRAM modules, such as indicated at 124 and 126. The DRAM modules, such as modules 124 and 126, each comprise M DRAM devices. A command bus 128 is a unidirectional bus for carrying address and control information from memory controller 122 to the DRAM modules. Address and control information is typically transferred from memory controller 122 on command bus 128 in uniform packets on both rising and falling edges of a free-running clock (CCLK) provided on a clock line 130 from memory controller 122. Data busses 132a–m are bidirectional busses carrying write data from memory controller 122 to the DRAM modules and further carrying read data from the DRAM modules to memory controller 122. Two bidirectional data clocks, DCLK0 and DCLK1, are respectively provided on clock lines 34a–m and clock lines 36a–m.

DRAM module 124 includes a command buffer 140 for buffering commands from command bus 128 to be provided to M DRAM devices such as indicated at 142a and 142m. Similarly, the Nth DRAM module indicated at 126 includes a command buffer 144 which buffers commands from command bus 128 to M DRAM devices such as indicated at 146a and 146m.

Figure 3:
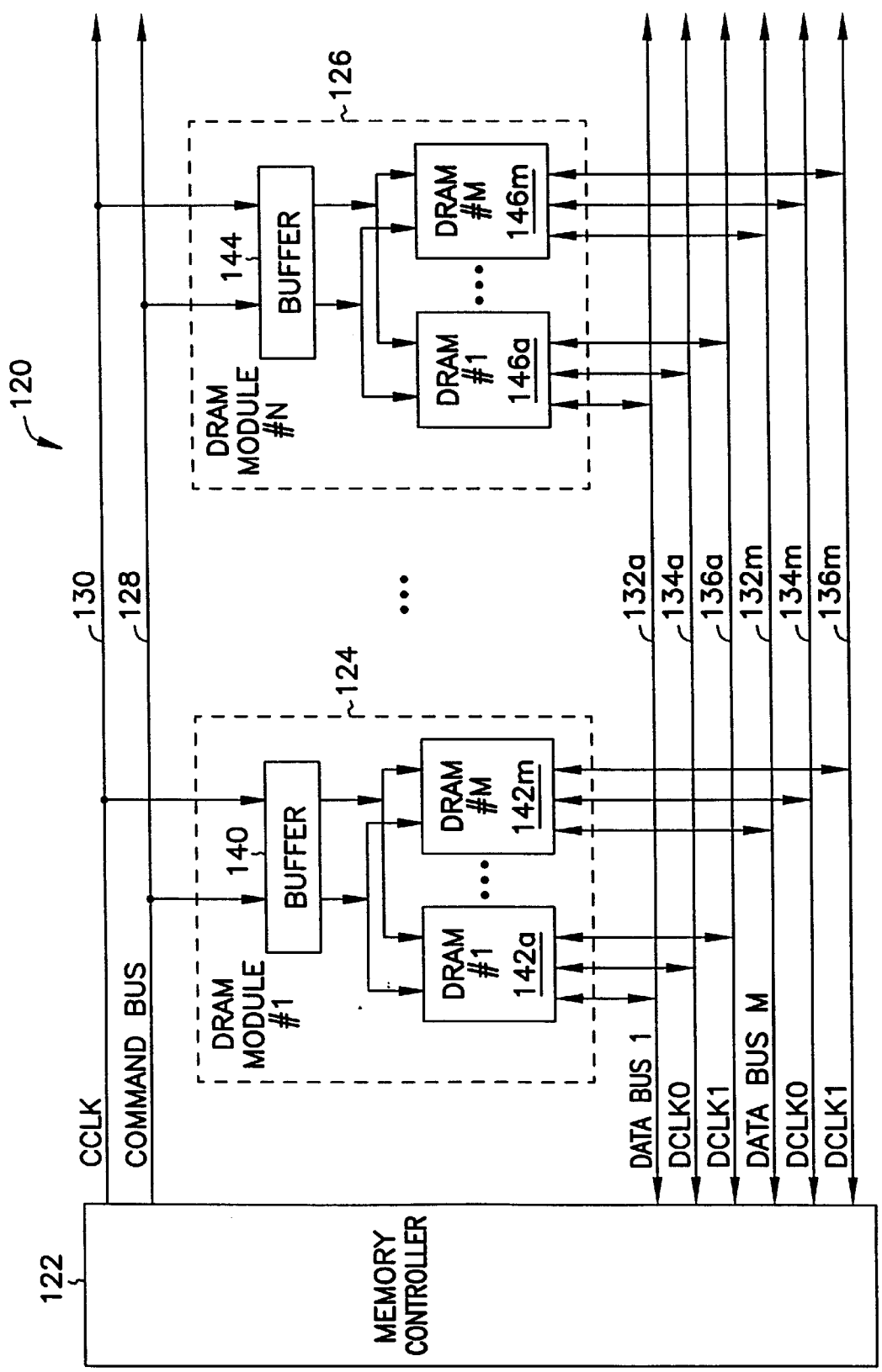
FIG. 3 is a block diagram of another embodiment of a memory system.

As illustrated in FIG. 3, memory system 120 does not include data buffers in the DRAM modules. Therefore memory system 20 includes M parallel data buses such as indicated at 132a and 132m. Corresponding data clocks are provided on 2M clock lines such as indicated at 134a and 134m for carrying DCLK0 and at 136a and 136m for carrying DCLK1. Memory system 120 is useful for memory applications requiring wider data buses for higher bandwidth, and yet not requiring command bus 128 to be duplicated for each data bus.

Figure 4:
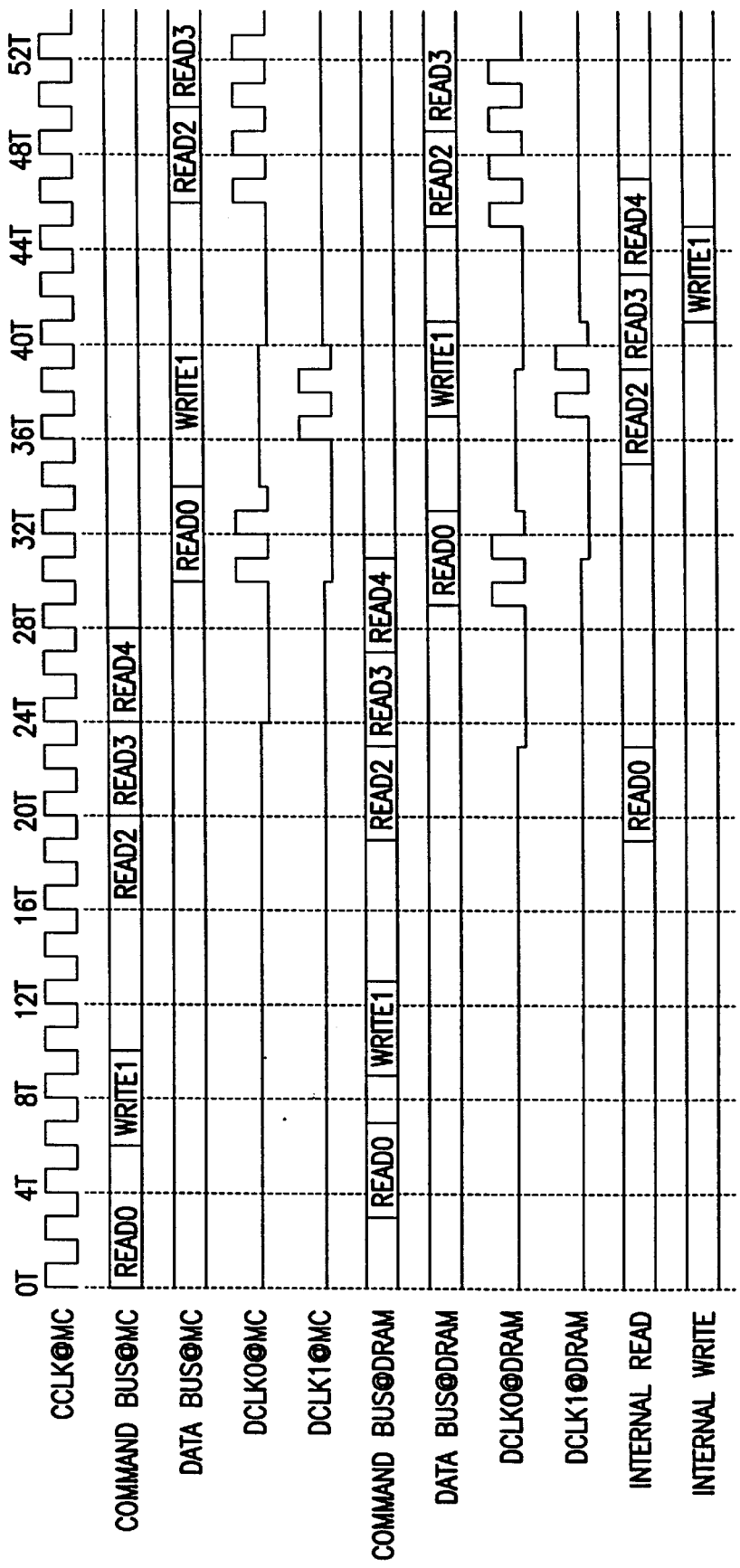
FIG. 4 is a timing diagram illustrating the bus timing of the memory system of FIG. 3.

FIG. 4 is a timing diagram illustrating bus timing for memory system 120. Again, as in FIG. 2, a sequence of four T read and write burst operations are illustrated in FIG. 3.

The command buffers such as indicated at 140 and 144 add an additional 2 T delay to get the command to the DRAM devices in the DRAM modules. Thus, the internal read operation starts at 19 T. Nevertheless, the vernier clock adjustment in the DRAM module is adjusted so that output read0 data is provided at 29 T to the corresponding data bus and the output data read0 correspondingly arrives at memory controller 122 at time 30 T.

As to the write operation, write data is provided at time 36 T, and arrives at the DRAM module at time 37 T to permit the internal write operation to be performed at 41 T similar to the write timing of memory system 20.

Figure 5:
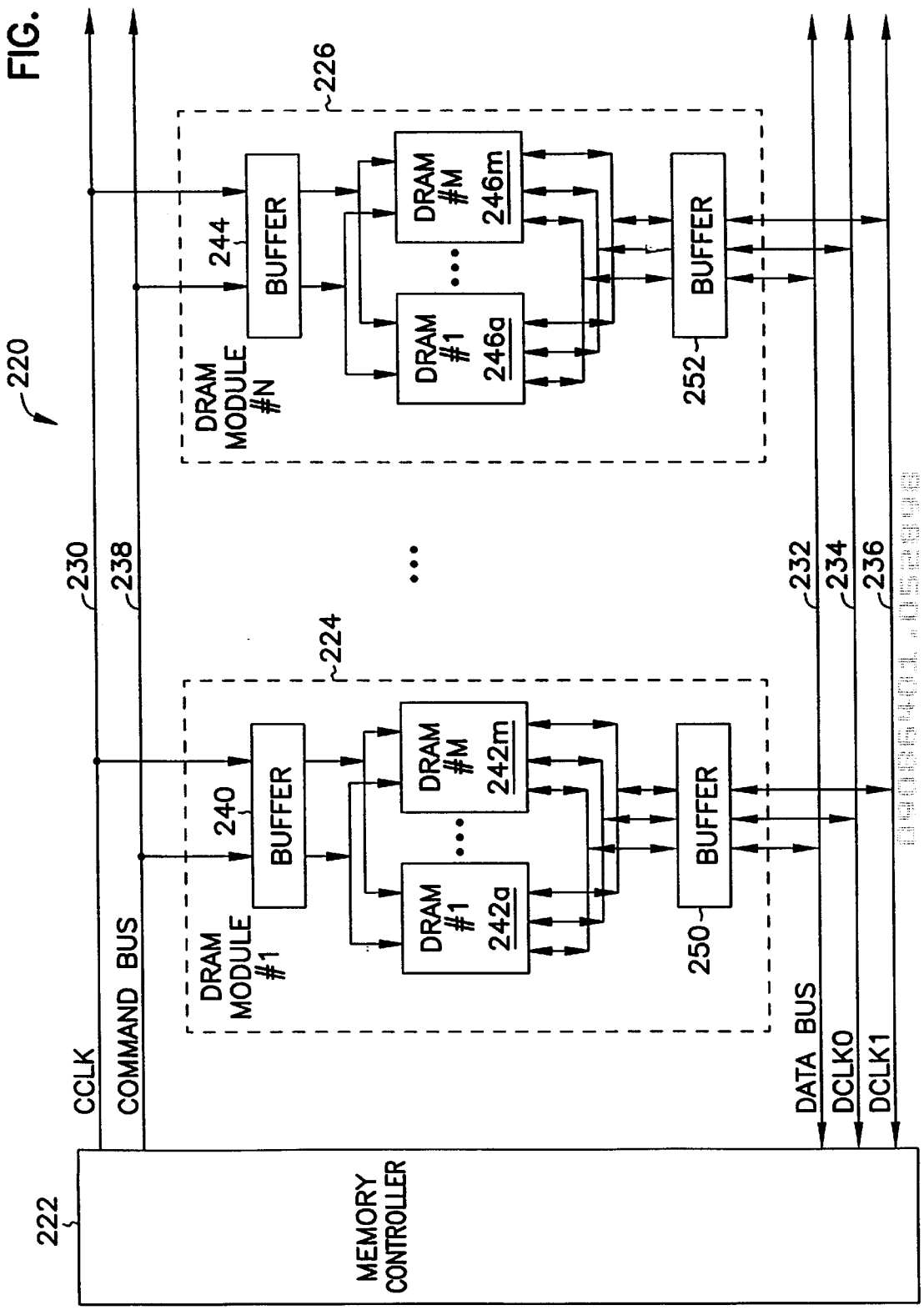
FIG. 5 is a block diagram of another embodiment of a memory system.

Another memory system which includes several DRAM devices per DRAM module is illustrated generally at 220 in FIG. 5. Memory system 220 includes a memory controller 222 and N DRAM modules, such as indicated at 224 and 226. The DRAM modules, such as modules 224 and 226, each comprise M DRAM devices. A command bus 228 is a unidirectional bus for carrying address and control information from memory controller 222 to the DRAM modules. Address and control information is typically transferred from memory controller 222 on command bus 228 in uniform packets on both rising and falling edges of a free-running clock (CCLK) provided on a clock line 230 from memory controller 222. A data bus 232 is a bidirectional bus carrying write data from memory controller 222 to the DRAM modules and further carrying read data from the DRAM modules to memory controller 222. Two bidirectional data clocks, DCLK0 and DCLK1, are respectively provided on clock line 234 and clock line 236.

The first DRAM module 224 includes a command buffer 240 which buffers commands to M DRAM devices, such as indicated at 242a and 242m. In addition, DRAM module 224 includes a data buffer 250 for buffering read and write data to be provided from and to the N DRAM devices 242a–m. Similarly, the Nth DRAM module 226 includes a command buffer 224 for buffering commands to M DRAM devices, such as indicated at 246a and 246m. In addition, DRAM module 226 includes a data buffer 252 for buffering read and write data from and to the M DRAM devices 246a–m. In the configuration of memory system 220 having the data buffers, only one data bus 232 and one set of DCLK clock lines are required. Thus, data buffers, such as data buffer 250 and data buffer 252, send and receive data from data bus 232 and send and receive the DCLK0 clock signal from clock line 234 and the DCLK1 clock signal from clock line 236.

The configuration of memory system 220 is useful where a very large memory configuration is required. For example, in one embodiment of memory system 220 where N=4 and M=8, up to eight DRAM devices are included in a single DRAM module and four DRAM modules are included in memory system 220 for a total of 32 DRAM devices in the memory system.

Because of the timing flexibility provided by the vernier clock adjustment circuitry in the individual DRAM devices, other embodiments of memory systems according to the present invention, such as memory system 20, 120, and 220, can accommodate both buffered and unbuffered modules. For example, a memory system according to the present invention may actually include: one or more DRAM modules which include no command buffers and no data buffers; one or more DRAM modules which include command buffers but no data buffers; and one or more DRAM modules which include both command buffers and data buffers. Whether a particular DRAM module includes buffers or partial buffers is completely transparent to the memory controller of the memory system according to the present invention.

Figure 6:
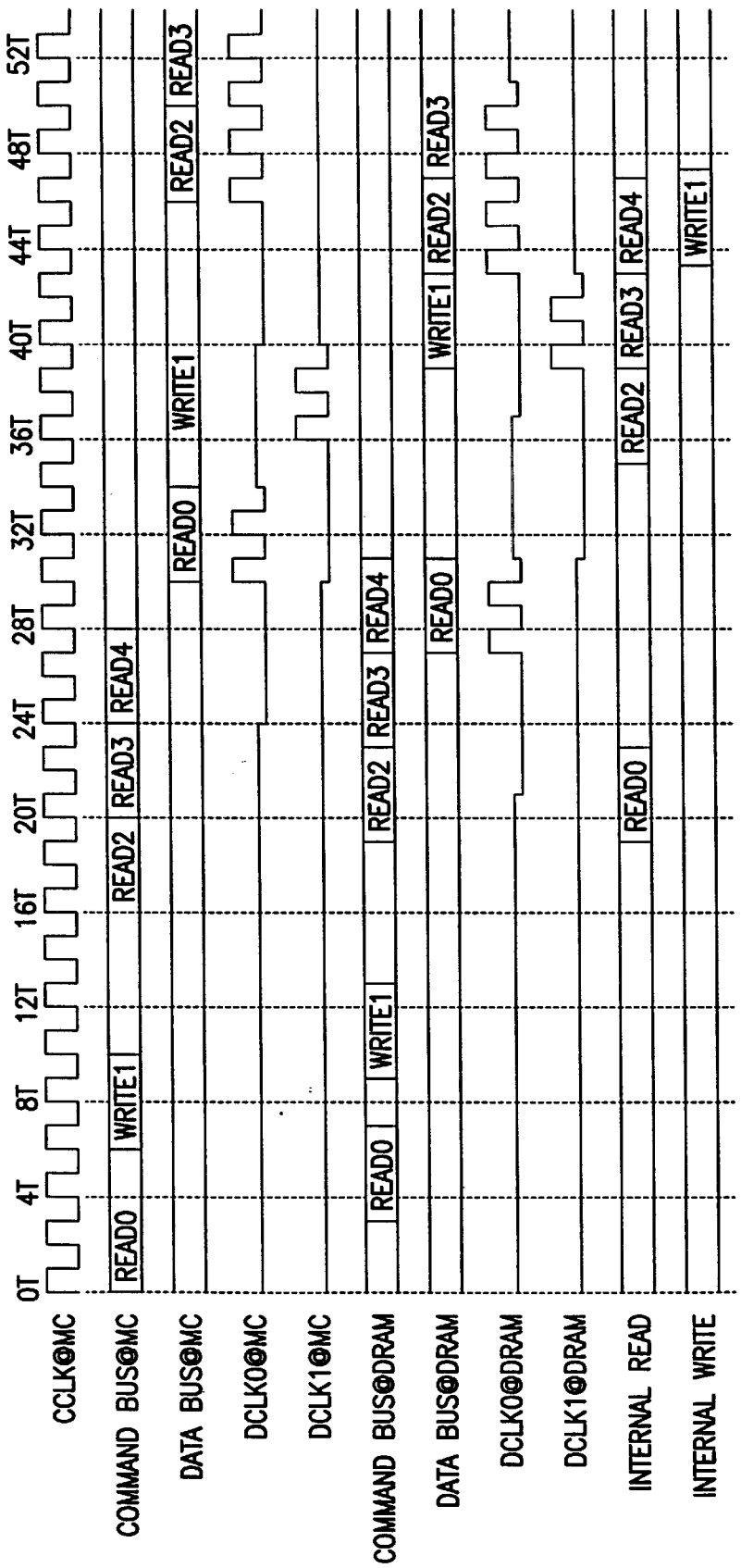
FIG. 6 is a timing diagram illustrating the bus timing of the memory system of FIG. 5.

FIG. 6 illustrates, in timing diagram form, the bus timing for memory system 220. As illustrated in FIG. 6, the data buffers, such as data buffers 250 and 252, add an additional 2 T delay to read data. Thus, the internal read operation still begins at time 19 T, just as in memory system 120. However, the vernier clock adjustment circuitry in the DRAMA module is adjusted to provide output data to data bus 232 at the DRAM module at time 27 T to assure arrival of the output data to memory controller 222 at time 30 T (i.e., 27 T plus 2 T delay from the data buffer plus the 1 T propagation delay on data bus 232). Thus, the read0 data arrives at the memory controller at 30 T whether or not command buffers and whether or not data buffers are used in the memory system.

In memory system 220, the write1 operation provides write1 data at time 36 T at memory controller 222, similar to the write1 operations illustrated in FIGS. 2 and 4 for memory systems 20 and 120. However, because of the 2 T delay from the data buffers, the write1 data arrives at the DRAM module at time 39 T instead of 37 T. Correspondingly, the internal write1 operation is performed beginning at time 43 T in memory system 220 instead of at time 41 T.

Vernier Clock Adjustment Circuitry

Figure 7:
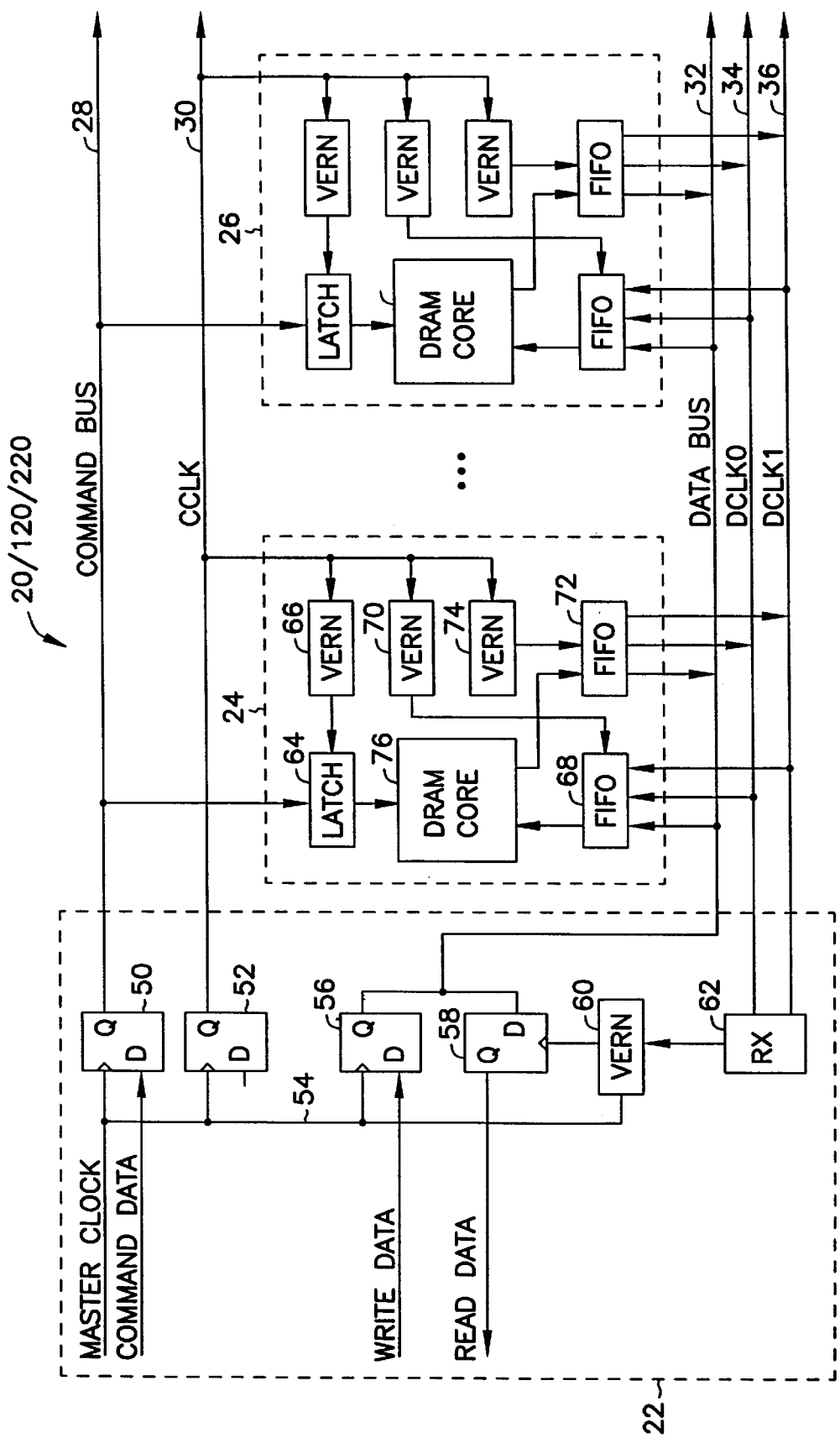
FIG. 7 is a block diagram of a memory system having vernier clock adjustment circuitry.

The vernier clock adjustment circuitry and other related circuitry of memory system 20 (or memory systems 120 and 220) is illustrated in block diagram form in FIG. 7. As illustrated in FIG. 7, memory controller 22 includes a command register 50 for providing commands to command bus 28 and a CCLK register 52 for providing the CCLK to clock line 30. A master clock is provided on a line 54 to registers 50 and 52. A write data register 56 is also clocked by the master clock on line 54 and provides write data to data bus 32. A read data register 58 receives read data from data bus 32 and receives its clock from an optional vernier clock adjustment circuit 60. Vernier clock adjustment circuit 60 receives the master clock from line 54 and the active one of the data clocks DCLK0 or DCLK1 via a register multiplexer 62, which receives DCLK0 and DCLK1 from clock lines 34 and 36.

DRAM module 24 includes a command latch 64 which receives commands from command bus 28. Command latch 64 receives a delayed CCLK clock from a command vernier clock adjustment circuit 66. Command vernier clock adjustment circuit 66 receives the CCLK clock signal from clock line 36. A write first-in, first-out (FIFO) buffer 68 receives the DCLK0 and DCLK1 clock signals from lines 34 and 36 and the write data from data bus 32 and provides write data to a DRAM core 76. Write FIFO buffer 68 receives a delayed CCLK clock from a write vernier clock adjustment circuit 70. Write vernier clock adjustment circuit 70 also receives the CCLK clock signal from clock line 36. A read FIFO buffer 72 receives read data from DRAM core 76 and provides the read data to data bus 32 along with the DCLK0 and DCLK1 clock signals to clock lines 34 and 36. Read FIFO buffer 72 receives a delayed CCLK clock from a read vernier clock adjustment circuit 74. Read vernier clock adjustment circuit 74 also receives the CCLK clock signal from clock line 30.

Bus Initialization

When memory systems 20/120/220 are powered up, the command timing, read timing, and write timing of each individual DRAM is adjusted by the memory controller 22/122/222 so that bursts of data on the data bus originating from different devices are properly spaced. DRAM devices from different suppliers, manufactured at different points in a process spread, operating at different temperatures and supply voltages, and occupying different positions along the command bus and data bus, and operating with and without command buffers and/or data buffers necessarily comprise a range of loop-around delays from the read command provided on command bus 28 at memory controller 22 to input read data to memory controller 22 at the memory controller on data bus 32. Similar variations occur in write data having a range of loop-around delays from the write command at memory controller 22 to write data to the selected DRAM device from data bus 32.

As illustrated in FIG. 7, each DRAM includes a variety of vernier adjustment circuits which compensate for all of these variables to permit read data from all DRAMs to arrive at memory controller 22 within fixed, deterministic timing, and similarly permit write data to arrive with fixed, deterministic timing to the selected DRAM devices.

In one embodiment of memory system 20/120/220, the adjustments to vernier clock adjustment circuit 66, 70, 74 in each DRAM device is made by writing a delay value in a register located in each DRAM device. For example, the delay typically includes a coarse adjustment setting providing a number of bit periods of delay adjustment, and a fine adjustment including a fine step to cover adjustment within a single bit.

Vernier adjustment circuits 66, 70, 74, and 60 are typically implemented with tapped delay lines. In one preferred embodiment of the invention, inverters are staged and various tapped points along the tapped delay lines provide the required variations in vernier adjustment delays. The vernier delays are optionally provided with phase-lock loop (PLL) or delayed-lock loop (DLL) circuitry where various phases are selected from different places to provide the required variations in vernier adjustment delays. The vernier clock adjustment circuits can be implemented in any suitable programmable delay elements.

During initialization, there are a variety of ways to adjust the vernier clock adjustment circuits. For example, one embodiment of memory system 20 runs through all delay steps of the vernier circuit and determines when data misses on low adjustments and on high adjustments and sets the vernier adjustment in an approximated optimal middle setting. Another embodiment of memory system 20 includes a feedback controller used to set the vernier settings by first selecting an estimated optimal setting and allowing the controller and feedback circuitry to arrive at the optimal delay setting for the vernier clock adjustment circuit.

The following is an example of vernier timing adjustments during initialization in one embodiment of memory system 20 without optional vernier clock adjustment circuit 60 in memory controller 22. In this embodiment, memory controller 22 sends commands to the first DRAM module 24 and the command clock adjustment circuit 66 in DRAM module 24 is adjusted to optimally receive the command at command latch 64 from the command bus 28. Then memory controller 22 starts a write command sequence and the write vernier adjustment circuit 70 in DRAM module 24 is adjusted to permit optimal receiving of the write data at write FIFO buffer 68 from data bus 32. Next, a read command sequence is started by memory controller 22 and the read vernier clock adjustment circuit 74 is adjusted to permit optimal receiving of read data at read data register 58 from data bus 32.

The command, write, and read vernier clock adjustment circuits are correspondingly adjusted with the above sequence of steps for each of the DRAM modules through the Nth DRAM module 26. Upon completion of these sequences, alignments of clocks, commands, write data bursts, and read data bursts from all sources are optimally adjusted.

The following is an alternative example of a read timing adjustment for an alternate embodiment of memory system 20 which includes vernier adjustment circuit 60 in memory controller 22. In this embodiment, at initialization, the read vernier delay is set to a minimum value in each of the DRAM devices. Then, memory controller circuit 22 sends out write data on data bus 32 and attempts to receive the write data at read data register 58. In this embodiment, memory controller 22 adjusts memory controller vernier clock adjustment circuit 60 to the optimal sampling instant. This adjustment establishes a read data timing reference point for ensuring timing alignment between write data bursts and read data bursts on data bus 32.

Memory controller 22 then sends read data instructions to the first DRAM module 24 and observes the corresponding DCLK pattern returning on the data clock line 34 or 36. Memory controller 22 then writes the vernier delay control register of read vernier clock adjustment circuit 74 or otherwise sets the delay of the read vernier clock adjustment circuit to increase the delay until read delay data can be optimally sampled by the same internal memory controller clock timing that was used to read and write data in the previous step.

Memory controller 22 correspondingly adjusts the read vernier clock adjustment circuits of each of the DRAM modules through the Nth DRAM module 26. Upon completion of this sequence, read data burst alignments from all sources are optimally adjusted.

With a similar initiation sequence performed for write operations and read operations, a constant delay from a command packet being provided on command bus 28 at memory controller 22 to read data or write data bursts at memory controller data bus I/O pins is established. In normal operation, one of DCLK0 or DCLK1 clocks is selected in vernier clock adjustment circuit 60 to latch the read data in read data register 58 instead of the master clock from line 54. Vernier circuit 60 of memory controller 22 can, however, be used periodically to monitor the timing of data from all sources and update DRAM vernier control registers as necessary to compensate for system timing drift.

At each DRAM device input, edges of CCLK clock and the DCLK clocks are coincident with data transitions on the command bus 28 and the data bus 32, respectively. To compensate for this, the CCLK clock and the DCLK clocks are typically delayed by one-half of a bit period with the vernier clock adjustment circuits to optimally sample incoming data. As mentioned above, and in reference to FIG. 7, the free-running CCLK is used to drive all internal DRAM timing. A delayed version of the CCLK is used to latch the command packets with vernier clock adjustment circuit 66. Similarly, vernier adjustment circuits 70 and 74 provide delayed versions of the free-running CCLK clock to respectively clock the write FIFO buffer 68 and the read FIFO buffer 72.

Individual Vernier Adjustment of the Rising and Falling Edge Clocks

Various problems occur in a memory system, such as memory systems 20, 120, and 220, when faster clock rates are used for the CCLK clock signal. For example, such memory systems include 400 Mbps per pin which requires a 200 MHz CCLK clock. In fact, such systems can include even faster data rates per pin, such as systems with 600 Mbps, 800 Mbps, 1 Gbps, and 1.2 Gbps per pin. With these faster data transitions, effects of jitter, skew, noise, overshoot and ringing result in smaller and smaller portions of a whole clock period where valid data can be clocked into a DRAM device.

The following example timing budget for a 400 Mbps per pin memory system illustrates this problem. In the 400 Mbps per pin memory system, the CCLK is 200 MHz or 2.5 N between each edge of the clock which is allocated as follows:

1) 250 ps for timing skew due to VREF drift and noise;
2) 500 ps for setup and hold window;
3) 400 ps for across-the-bus driver skew;
4) 200 ps for across-the-bus load variations;
5) 100 ps for across-the-bus path matching (PCB traces);
6) 500 ps for pulse width dependent skew (data dependency);
7) 200 ps for clock and data jitter (noise induced); and
8) 350 ps for total data read variation from module to module after trimming. Data error primarily due to worst case trim resolution. Timing errors trimmed out include bus path length differences of modules on the bus and differing DRAM access times from the clock.

This problem is further illustrated by FIGS. 8A and 8B in timing diagram form. In FIG. 8A, an ideal signal waveform is indicated at 80 having data valid between the times indicated between arrows 82. As illustrated in FIG. 8A, ideal signal waveform 80 forms a big eye pattern. By contrast, in FIG. 8B a non-ideal waveform is indicated at 84, which has a significantly reduced valid data period indicated by arrows 86. The non-ideal waveform 84 is produced as a result of jitter, skew, noise, overshoot, ringing and other such known problems.

In order to compensate for such problems and to properly latch incoming data into each DRAM, a second tier of vernier adjustment is added according to the present invention to the vernier adjustment circuitry in each DRAM module to individually adjust both a clock's falling-edge timing independent of or interdependent on the clock's rising edge.

Figure 9:
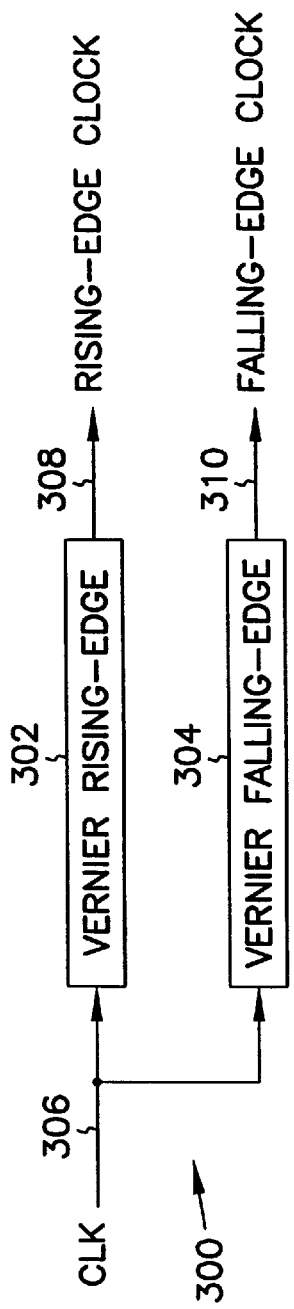
FIG. 9 is a block diagram of an independent rising and falling edge vernier clock adjustment system.

One embodiment of such a vernier clock adjustment system is illustrated generally at 300 in FIG. 9. Vernier clock adjustment system 300 includes a rising-edge vernier adjustment circuit 302 and a falling-edge vernier adjustment circuit 304. A clock signal (CLK) is provided to the vernier adjustment circuits 302 and 304 on a clock line 306. Vernier clock adjustment circuit 302 independently delays the CLK signal from clock line 306 to provide a delayed version of the CLK signal on a clock line 308. The delayed clock on clock line 308 is used for rising-edge clockings. Falling-edge vernier clock adjustment circuit 304 independently delays the CLK signal from clock line 306 to provide a delayed version of the CLK signal on a clock line 310. The delayed clock signal on line 310 is used for falling-edge clockings. Thus, vernier clock adjustment system 300 includes two completely separate vernier circuits, one for independently delaying each clock edge.

Figure 10:
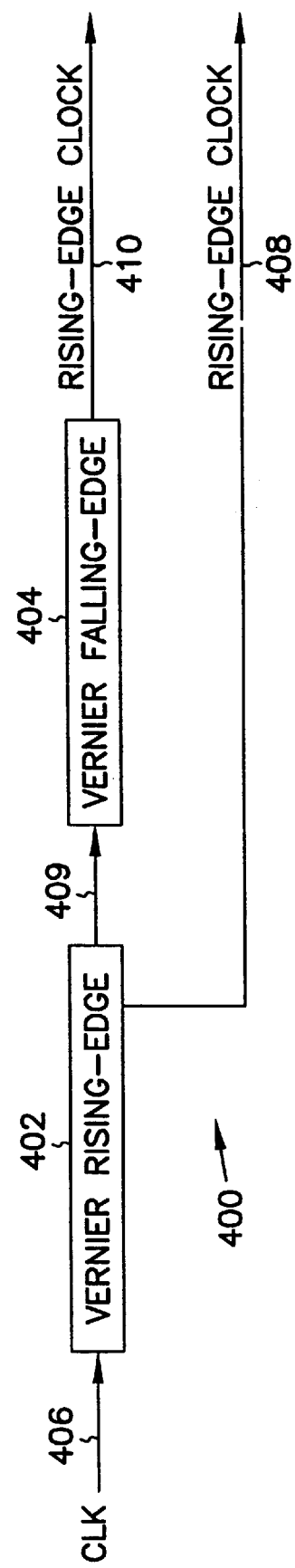
FIG. 10 is a block diagram of an interdependent cascaded rising and falling edge vernier clock adjustment system.

Another embodiment of a vernier clock adjustment system according to the present invention is illustrated generally at 400 in FIG. 10. Vernier clock adjustment system 400 includes cascaded vernier clock adjustment circuits 402 and 404. A CLK signal is provided on a line 406 to vernier clock circuit 402. Vernier clock circuit 402 provides a delayed version of the CLK signal on a clock line 408. The delayed clock on line 408 is used for rising-edge clockings. Vernier clock adjustment circuit 402 also provides the same delayed version of the CLK signal to the second vernier clock adjustment circuit 404 via a line 409. Vernier clock adjustment circuit 404 further delays the clock signal to provide a delayed clock signal on a clock line 410. The delayed clock signal on line 410 is in used for falling-edge clockings. In the cascaded vernier adjustment system 400, the falling-edge timing is based upon the rising-edge timing. An alternative embodiment (not shown) of the vernier clock adjustment system 400 is configured to make the rising edge timing be based on the falling edge timing.

Vernier clock adjustment systems 300 and 400 are preferably employed in command vernier clock adjustment circuit 66, write vernier clock adjustment circuit 70, and read vernier clock adjustment circuit 74 of DRAM module 24 and the other DRAM modules of memory systems 20/120/220, such as illustrated in FIG. 7. Optionally, vernier adjustment circuit 60 of the memory controller 22 also includes such individual edge adjustment as provided by either vernier clock system 300 or 400.

In one embodiment of the memory system 20/120/220, during system initialization, rising-edge clock data is first adjusted, followed by falling-edge clock data. The rising-edge clock data is adjusted by adjusting the delay provided by the rising-edge vernier adjustment circuit 302 of system 300 or circuit 402 of system 400. The falling-edge clock data is then adjusted by adjusting the delay of falling-edge vernier adjustment circuit 304 of system 300 or circuit 404 of system 400. Alternate embodiments of memory system 20/120/220, first adjust the falling-edge time followed by the rising edge timing during system initialization.

The falling-edge and rising-edge adjustments provided by vernier clock adjustment systems 300 and 400 are especially beneficial to lessen memory system demands upon clock duty cycle. Specifically, the echo clock scheme employed for producing DCLK0 and DCLK1 in the memory systems 20, 120, and 220 is especially vulnerable to duty cycle problems since each DRAM device must receive a clock and retransmit the clock with the read data. Each time the clock is converted to and from the data bus, the duty cycle is affected. The memory system according to the present invention compensates for these duty cycle problems by employing the clock verniers to individually adjust both the rising and falling edges of the clock.

Moreover, a memory system, such as memory system 20, 120, or 220, typically operates on an industry standard protocol where the DRAM devices, whether or not manufactured from different suppliers, look the same to the memory controller. In addition, from the point of view of the memory controller, the DRAM devices may be at different points in the process spread, such as at 400 Mbps as compared to 800 Mbps. In addition, DRAM devices may be operating at different temperatures and supply voltages and be occupying different positions along the command bus and data bus, and at the same time the DRAM devices can be with and without command buffers and data buffers. The more precise adjustment of adjusting both falling and rising edge of the clocks better compensates for these problems.

Conclusion

By employing the vernier clock adjustment circuitry and method according to the present invention in memory systems, such as memory systems 20/120/220, the effects of duty cycle variation, bus position of a given memory device, timing drift, loading variations, clock jitter, clock skew, noise, overshoot, and ringing are more accurately and precisely compensated for by individually adjusting both the rising-edge and falling-edge timings, either independently or interdependently from each other. In this way, data can be accurately clocked in the memory devices even at higher data transmission rates.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An integrated circuit, comprising:
    a vernier clock adjustment circuit receiving an input clock signal, the vernier clock adjustment circuit including a rising-edge delay circuit receiving the input clock signal and providing a rising-edge clock signal representing the input clock signal delayed by a rising-edge delay, the vernier clock adjustment circuit further including a falling-edge delay circuit receiving the rising-edge clock signal and providing a falling-edge clock signal representing the input clock signal delayed by a falling-edge delay; and
    an edge triggered circuit receiving a binary signal, the rising-edge clock signal and the falling-edge clock signal, the edge triggered circuit performing a first operation on the binary signal at a first edge of the rising-edge clock signal and performing a second operation at a second edge of the falling-edge clock signal.

2. The integrated circuit of claim 1 wherein the first edge of the rising-edge clock signal comprises the rising-edge of the rising-edge clock signal.

3. The integrated circuit of claim 1 wherein the second edge of the falling-edge clock signal comprises the falling-edge of the falling-edge clock signal.

4. The integrated circuit of claim 1 wherein the first operation performed by the edge triggered circuit comprises storing the binary signal at the first edge of the of the rising-edge clock signal.

5. The integrated circuit of claim 1 wherein the second operation performed by the edge triggered circuit comprises storing the binary signal at the second edge of the of the falling-edge clock signal.

6. The integrated circuit of claim 1 wherein the edge triggered circuit comprises a First-In, First-Out buffer that transfers samples of the binary signal on each first edge of the rising-edge clock signal and each second edge of the falling-edge clock signal.

7. The integrated circuit of claim 1 wherein the edge triggered circuit comprises a latch that stores a respective samples of the binary signal on each first edge of the rising-edge clock signal and each second edge of the falling-edge clock signal.

8. An integrated circuit, comprising:
    a vernier clock adjustment circuit receiving an input clock signal, the vernier clock adjustment circuit including a falling-edge delay circuit receiving the input clock signal and providing a falling-edge clock signal representing the input clock signal delayed by a falling-edge delay, the vernier clock adjustment circuit further including a rising-edge delay circuit receiving the falling-edge clock signal and providing a rising-edge clock signal representing the input clock signal delayed by a rising-edge delay; and
    an edge triggered circuit receiving a binary signal, the falling-edge clock signal and the rising-edge clock signal, the edge triggered circuit performing a first operation on the binary signal at a first edge of the falling-edge clock signal and performing a second operation at a second edge of the rising-edge clock signal.

9. The integrated circuit of claim 8 wherein the first edge of the falling-edge clock signal comprises the falling-edge of the falling-edge clock signal.

10. The integrated circuit of claim 8 wherein the second edge of the rising-edge clock signal comprises the rising-edge of the rising-edge clock signal.

11. The integrated circuit of claim 8 wherein the first operation performed by the edge triggered circuit comprises storing the binary signal at the first edge of the of the falling-edge clock signal.

12. The integrated circuit of claim 8 wherein the second operation performed by the edge triggered circuit comprises storing the binary signal at the second edge of the of the rising-edge clock signal.

13. The integrated circuit of claim 8 wherein the edge triggered circuit comprises a First-In, First-Out buffer that transfers samples of the binary signal on each first edge of the falling-edge clock signal and each second edge of the rising-edge clock signal.

14. The integrated circuit of claim 8 wherein the edge triggered circuit comprises a latch that stores a respective samples of the binary signal on each first edge of the falling-edge clock signal and each second edge of the rising-edge clock signal.

15. A signal coupling system, comprising:
    a memory controller generating a clock signal on a clock terminal and a plurality of bits of a digital signal on a signal bus;
    a vernier clock adjustment circuit having a clock input coupled to the clock terminal of the memory controller to receive the clock signal from the memory controller, the vernier clock adjustment circuit providing a rising-edge clock signal representing the input clock signal delayed by a rising-edge delay and providing a falling-edge clock signal representing the input clock signal delayed by a falling-edge delay, the vernier clock adjustment circuit further having a delay adjustment input adapted to receive delay control signals controlling the magnitude of the rising-edge delay and the falling-edge delay; and a plurality of latches, each latch having an input terminal coupled to a respective bit of the signal bus and first and second clock terminals coupled to the vernier clock adjustment circuit to receive the rising-edge clock signal and the falling-edge clock signal, the latches being constructed to store respective bits of the digital signal from the memory controller on the rising-edge of the rising-edge clock signal and on the falling-edge of the falling-edge clock signal.

16. The signal coupling system of claim 15, wherein the vernier clock adjustment circuit comprises:

a rising-edge delay circuit receiving the input clock signal and providing a rising-edge clock signal representing the input clock signal delayed by a rising-edge delay; and a falling-edge delay circuit receiving the rising-edge clock signal and providing a falling-edge clock signal representing the input clock signal delayed by a falling-edge delay.

17. The signal coupling system of claim 15, wherein the vernier clock adjustment circuit comprises:

a falling-edge delay circuit receiving the input clock signal and providing a falling-edge clock signal representing the input clock signal delayed by a falling-edge delay; and a rising-edge delay circuit receiving the falling-edge clock signal and providing a rising-edge clock signal representing the input clock signal delayed by a rising-edge delay.

18. The signal coupling system of claim 15, wherein the vernier clock adjustment circuit comprises:

a rising-edge delay circuit receiving the input clock signal and independently providing a rising-edge clock signal representing the input clock signal delayed by a rising-edge delay; and a falling-edge delay circuit receiving the input clock signal and independently providing a falling-edge clock signal representing the input clock signal delayed by a falling-edge delay.

19. A signal coupling system, comprising:

a memory controller generating a clock signal on a clock terminal and receiving or supplying a plurality of bits of a digital signal on a signal bus;

a vernier clock adjustment circuit having a clock input coupled to the clock terminal of the memory controller to receive the clock signal from the memory controller, the vernier clock adjustment circuit providing a rising-edge clock signal representing the input clock signal delayed by a rising-edge delay and providing a falling-edge clock signal representing the input clock signal delayed by a falling-edge delay, the vernier clock adjustment circuit further having a delay adjustment input adapted to receive delay control signals controlling the magnitude of the rising-edge delay and the falling-edge delay; and a plurality of First-In, First-Out ("FIFO") buffers, each having an input terminal coupled to a respective bit of the signal bus and first and second clock terminals coupled to the vernier clock adjustment circuit to receive the rising-edge clock signal and the falling-edge clock signal, the FIFO buffers being constructed to receive respective bits of the digital signal from the memory controller or supply respective bits of the digital signal to the memory controller on the rising-edge of the rising-edge clock signal and on the falling-edge of the falling-edge clock signal.

20. The signal coupling system of claim 19, wherein the vernier clock adjustment circuit comprises:

a rising-edge delay circuit receiving the input clock signal and providing a rising-edge clock signal representing the input clock signal delayed by a rising-edge delay; and a falling-edge delay circuit receiving the rising-edge clock signal and providing a falling-edge clock signal representing the input clock signal delayed by a falling-edge delay.

21. The signal coupling system of claim 19, wherein the vernier clock adjustment circuit comprises:

a falling-edge delay circuit receiving the input clock signal and providing a falling-edge clock signal representing the input clock signal delayed by a falling-edge delay; and a rising-edge delay circuit receiving the falling-edge clock signal and providing a rising-edge clock signal representing the input clock signal delayed by a rising-edge delay.

22. The signal coupling system of claim 19, wherein the vernier clock adjustment circuit comprises:

a rising-edge delay circuit receiving the input clock signal and independently providing a rising-edge clock signal representing the input clock signal delayed by a rising-edge delay; and a falling-edge delay circuit receiving the input clock signal and independently providing a falling-edge clock signal representing the input clock signal delayed by a falling-edge delay.

23. A memory device comprising:

a data bus coupling data to and from the memory device;

a plurality of arrays of memory cells for storing data, the arrays of memory cells including a data path coupling data to and from the data bus;

a command bus receiving commands to generate control signals corresponding thereto;

a clock line receiving an input clock signal; and a vernier clock adjustment circuit receiving the input clock signal, the vernier clock adjustment circuit including a rising-edge delay circuit receiving the input clock signal and providing a rising-edge clock signal representing the input clock signal delayed by a rising-edge delay, the vernier clock adjustment circuit further including a falling-edge delay circuit receiving the rising-edge clock signal and providing a falling-edge clock signal representing the input clock signal delayed by a falling-edge delay; and an edge triggered circuit receiving the rising-edge clock signal and the falling-edge clock signal, the edge triggered circuit performing a predetermined operation in the memory device at a first edge of the rising-edge clock signal and at a second edge of the falling-edge clock signal.

24. The memory device of claim 23 wherein the first edge of the rising-edge clock signal comprises the rising-edge of the rising-edge clock signal.

25. The memory device of claim 23 wherein the second edge of the falling-edge clock signal comprises the falling-edge of the falling-edge clock signal.

26. The memory device of claim 23 wherein the predetermined operation performed by the edge triggered circuit comprises storing data applied to the memory device at the first edge of the of the rising-edge clock signal and at the second edge of the of the falling-edge clock signal.

27. The memory device of claim 23 wherein the predetermined operation performed by the edge triggered circuit comprises outputting data from the memory device at the first edge of the of the rising-edge clock signal and at the second edge of the of the falling-edge clock signal.

28. The memory device of claim 23 wherein the predetermined operation performed by the edge triggered circuit comprises storing a command signal applied to the memory device at the first edge of the of the rising-edge clock signal and at the second edge of the of the falling-edge clock signal.

29. The memory device of claim 23 wherein the edge triggered circuit comprises a First-In, First-Out buffer that is operable to transfer a binary signal into and out of the buffer responsive to the first edge of the of the rising-edge clock signal and at the second edge of the of the falling-edge clock signal.

30. The memory device of claim 23 wherein the edge triggered circuit comprises a latch that is operable to store a binary signal responsive to the first edge of the of the rising-edge clock signal and at the second edge of the of the falling-edge clock signal.

31. A memory device comprising:
   a data bus coupling data to and from the memory device;
   a plurality of arrays of memory cells for storing data, the arrays of memory cells including a data path coupling data to and from the data bus;
   a command bus receiving commands to generate control signals corresponding thereto;
   a clock line receiving an input clock signal; and
   a vernier clock adjustment circuit receiving the input clock signal, the vernier clock adjustment circuit including a falling-edge delay circuit receiving the input clock signal and providing a falling-edge clock signal representing the input clock signal delayed by a falling-edge delay, the vernier clock adjustment circuit further including a rising-edge delay circuit receiving the falling-edge clock signal and providing a rising-edge clock signal representing the input clock signal delayed by a rising-edge delay; and
   an edge triggered circuit receiving the rising-edge clock signal and the falling-edge clock signal, the edge triggered circuit performing a predetermined operation in the memory device at a first edge of the falling-edge clock signal and at a second edge of the rising-edge clock signal.

32. The memory device of claim 31 wherein the first edge of the failing-edge clock signal comprises the falling-edge of the falling-edge clock signal.

33. The memory device of claim 31 wherein the second edge of the rising-edge clock signal comprises the rising-edge of the rising-edge clock signal.

34. The memory device of claim 31 wherein the predetermined operation performed by the edge triggered circuit comprises storing data applied to the memory device at the first edge of the of the falling-edge clock signal and at the second edge of the of the rising-edge clock signal.

35. The memory device of claim 31 wherein the predetermined operation performed by the edge triggered circuit comprises outputting data from the memory device at the first edge of the of the falling-edge clock signal and at the second edge of the of the rising-edge clock signal.

36. The memory device of claim 31 wherein the predetermined operation performed by the edge triggered circuit comprises storing a command signal applied to the memory device at the first edge of the of the falling-edge clock signal and at the second edge of the of the rising-edge clock signal.

37. The memory device of claim 31 wherein the edge triggered circuit comprises a First-In, First-Out buffer that is operable to transfer a binary signal into and out of the buffer responsive to the first edge of the of the falling-edge clock signal and at the second edge of the of the rising-edge clock signal.

38. The memory device of claim 31 wherein the edge triggered circuit comprises a latch that is operable to store a binary signal responsive to the first edge of the of the falling-edge clock signal and at the second edge of the of the rising-edge clock signal.

39. A method of operating an integrated circuit, comprising:
   receiving an input clock signal;
   delaying the input clock signal by a rising-edge delay to provide a rising-edge clock signal;
   delaying the rising-edge clock signal by a falling-edge delay to provide a falling-edge clock signal;
   performing a first operation on the binary signal at a first edge of the rising-edge clock signal; and
   performing a second operating at a second edge of the falling-edge clock signal.

40. The method of claim 39 wherein the first edge of the rising-edge clock signal comprises the rising-edge of the rising-edge clock signal.

41. The method of claim 39 wherein the second edge of the falling-edge clock signal comprises the falling-edge of the falling-edge clock signal.

42. The method of claim 39 wherein the first operation comprises storing the binary signal at the first edge of the of the rising-edge clock signal.

43. The method of claim 39 wherein the second operation comprises storing the binary signal at the second edge of the of the falling-edge clock signal.

44. A method of operating an integrated circuit, comprising:
   receiving an input clock signal;
   delaying the input clock signal by a falling-edge delay to provide a falling-edge clock signal;
   delaying the falling-edge clock signal by a rising-edge delay to provide a rising-edge clock signal;
   performing a first operation on the binary signal at a first edge of the falling-edge clock signal; and
   performing a second operating at a second edge of the rising-edge clock signal.

45. The method of claim 44 wherein the first edge of the falling-edge clock signal comprises the falling-edge of the falling-edge clock signal.

46. The method of claim 44 wherein the second edge of the rising-edge clock signal comprises the rising-edge of the rising-edge clock signal.

47. The method of claim 44 wherein the first operation comprises storing the binary signal at the first edge of the of the falling-edge clock signal.

48. The method of claim 44 wherein the second operation comprises storing the binary signal at the second edge of the of the rising-edge clock signal.

49. A method of operating an integrated circuit, comprising:

receiving an input clock signal;

generating a first trigger signal subsequent to each rising-edge of the input clock signal, each first trigger signal being generated after a rising-edge delay has elapsed from each rising-edge of the input clock signal;

generating a second trigger signal subsequent to each falling-edge of the input clock signal, each second trigger signal being generated after a falling-edge delay has elapsed from each falling-edge of the input clock signal; and performing a predetermined operation on the binary signal responsive to each of the first and second trigger signals.

50. The method of claim 49 wherein, the magnitude of the rising-edge delay is determined independently of the magnitude of the falling-edge delay.

51. The method of claim 49 wherein, the predetermined operation comprises storing a respective sample of the binary signal responsive to each of the first and second trigger signals.

52. The method of claim 49 further comprising adjusting the magnitudes of the rising-edge delay and the falling-edge delay.

53. A method of operating an integrated circuit, comprising:

receiving an input clock signal;

establishing a rising-edge delay value;

establishing a falling-edge delay value;

performing a first operation in the integrated circuit after a first delay has elapsed from each rising-edge of the input clock signal, the first delay corresponding to the rising-edge delay value; and performing a second operation in the integrated circuit after a second delay has elapsed from each falling-edge of the input clock signal, the second delay corresponding to the falling-edge delay value.

54. The method of claim 53 wherein establishing the falling-edge delay value comprises establishing the falling-edge delay value independently of the magnitude of the rising-edge delay value.

55. The method of claim 53 wherein the first operation comprises storing a sample of a binary signal each time the first delay corresponding to the rising-edge delay value has elapsed from each rising-edge of the input clock signal.

56. The method of claim 53 wherein the first operation comprises storing a sample of a binary signal each time the second delay corresponding to the falling -edge delay value has elapsed from each falling-edge of the input clock signal.

57. The method of claim 53 further comprising adjusting the rising-edge delay value and the magnitude of the falling-edge delay value.

58. A method of operating an integrated circuit, comprising:

receiving an input clock signal;

establishing a falling-edge delay value;

establishing a rising-edge delay value;

performing a first operation in the integrated circuit after a first delay has elapsed from each falling-edge of the input clock signal, the first delay corresponding to the falling-edge delay value; and performing a second operation in the integrated circuit after a second delay has elapsed from each rising-edge of the input clock signal, the second delay corresponding to the rising-edge delay value.

59. The method of claim 58 wherein the first operation comprises storing a sample of a binary signal each time the first delay corresponding to the rising-edge delay value has elapsed from each rising-edge of the input clock signal.

60. The method of claim 58 wherein the first operation comprises storing a sample of a binary signal each time the second delay corresponding to the falling -edge delay value has elapsed from each falling-edge of the input clock signal.

61. The method of claim 58 further comprising adjusting the magnitude of the rising-edge delay value and the magnitude of the falling-edge delay value.

62. The method of claim 58 wherein adjusting the magnitude of the rising-edge delay value and the magnitude of the falling-edge delay value comprising adjusting the magnitude of the rising-edge delay value independently of the magnitude of the falling-edge delay value.

* * * * *

UNITED STATES PATENT AND TRADEMARK OFFICE
CERTIFICATE OF CORRECTION

PATENT NO.    :   6,016,282
DATE          :   January 18, 2000
INVENTORS     :   Keeth It is hereby certified that error appears in the above-identified patent and that said Letters Patent are hereby corrected as shown below:

| Column | Reads | Should Read |
|---|---|---|
| Column 6, line 34 | "DRAMA" | - -DRAM - - |

Signed and Sealed this

Fifteenth Day of May, 2001

*Attest:*

NICHOLAS P. GODICI

*Attesting Officer*    Acting Director of the United States Patent and Trademark Office